United States Patent [19]

Kwong et al.

[11] Patent Number: 5,114,826
[45] Date of Patent: May 19, 1992

[54] PHOTOSENSITIVE POLYIMIDE COMPOSITIONS

[75] Inventors: Ranee W. Kwong; Harbans S. Sachdev; Krishna G. Sachdev, all of Wappingers Falls, N.Y.

[73] Assignee: IBM Corporation, Armonk, N.Y.

[21] Appl. No.: 458,130

[22] Filed: Dec. 28, 1989

[51] Int. Cl.$^5$ ............... C08F 2/46; C08G 73/14; C08J 3/28; G03C 1/52
[52] U.S. Cl. ............... 430/192; 252/600; 522/39; 522/47; 522/50; 430/197; 430/270
[58] Field of Search ............ 252/600; 430/175, 176, 430/192, 197; 522/39, 47, 50

[56] References Cited

U.S. PATENT DOCUMENTS

| | | | |
|---|---|---|---|
| 4,631,245 | 12/1986 | Pawlowski | 430/175 |
| 4,912,018 | 3/1990 | Osuch et al. | 430/176 X |
| 4,927,736 | 5/1990 | Mueller et al. | 430/176 X |
| 4,942,108 | 7/1990 | Moreau et al. | 430/192 X |

FOREIGN PATENT DOCUMENTS 0291779 11/1988 European Pat. Off. ............ 430/192

*Primary Examiner*—Richard D. Lovering
*Attorney, Agent, or Firm*—John A. Stemwedel

[57] ABSTRACT

New photosensitive polyimide compositions and processes of using the same in the fabrication of electronic components are provided. These compositions are comprised of

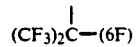

$(CF_3)_2C-(6F)$ containing polyamic acids and/or the corresponding hydroxy-polyamic esters, or hydroxypolyimides and a photoactive component as an additive or as covalently bonded functionality on the polymer chain. These compositions provide positive or negative patterning options and may be used as conventional resist materials, as imageable dielectric or passivating layers, as high Tg ion implant masks or as imageable lift-off layers in the fabrication of multilevel metal structures.

23 Claims, No Drawings

PHOTOSENSITIVE POLYIMIDE COMPOSITIONS

BACKGROUND OF THE INVENTION

1. Field of Invention

This invention relates to new photosensitive polyimide compositions and simplified lithographic processes achieved by their use. More particularly, this invention is directed to the use of hydroxypolyimides and hydroxypolyimide precursors as high temperature stable imageable layers for use as photoresists and in the formation of imaged dielectrics.

2. Background Art

The invention relates to lithographic processes and materials for process simplification, reduced production cost and improved performance of multilayer metal structures in microelectronic fabrication. It is generally known in semiconductor technology that there are several advantages in the use of polyimides as insulating or passivating material in electronic components. According to conventional techniques, a polyimide precursor is applied from a solution in a suitable solvent and the film formed is subjected to a bake/cure cycle to form the polyimide. Patterning of such film is carried out according to standard procedures involving dry etching or reactive ion etching (RIE) when using a multilayer resist process. Recently, there has been much interest in the development and utility of directly patternable or photosensitive polyimides which can be imaged according to the standard lithographic techniques. These materials are polyimide precursors which are imidized after they are patterned. This approach has the advantage of providing simplified process for the polyimide dielectric patterning and thus has the potential for reduced cost due to fewer number of operations. In addition to use as imageable dielectric, photosensitive polyimides are also attractive for application as high Tg and high temperature stable resist materials. The conventional resist compositions derived from novolak resins (phenol-formaldehyde resins) and diazonaphthoquinone based photoactive component are suitable only for low temperature metallization (80°-90° C.) due to the low Tg of novolak based systems. When the patterned resist layer is UV hardened to provide cross-linking, the upper limit for subsequent metallization process can be extended to about 150° C. This increases processing difficulties since the hardened resist layer has to be stripped by dry etching, hot KOH or strong acid treatment which results in ionic contamination and can lead to defects and dislocations detrimental to device performance. Thus the novolak based photoresist systems containing diazonaphthoquinone sensitizers have limited high temperature application due to low Tg, low thermal stability, UV hardening required prior to high temperature processing.

In keeping with the need for thermally stable, high Tg resists which may also be used for permanent dielectric applications, several photosensitive imidizable formulations have become commercially available. Although the materials from different sources have different levels of radiation sensitivity and properties of fully imidized patterned films, most are based on Siemens technology, comprising acrylate functionalized polyamic ester or ammonium salt forming component and suitable photoinitiators. The olefinic pendant group crosslinks on exposure to UV radiation which results in increased molecular weight in the exposed region and thus pattern can be developed by selective removal of the unexposed region during subsequent solvent development. The resist is then converted to thermally stable polyimide pattern by further bake/cure cycle.

It has been generally observed that such photosensitive polyimides suffer from several limitations and are not suitable for high density integrated circuits. For example, there is 40–50% shrinkage in film thickness between image development and final cure to polyimide which results in distortion of pattern profile where the sidewalls collapse inwards as substrate adhesion prevents isotropic contraction. Other limitations are the resolution, shallow profiles, poor shelf life, and problem of contrast. These limitations are typical of this class of materials in general.

The development of photosensitive imidizable materials is typified by compounds and processes that have become known as "Siemens technology". These materials are typically compositions comprising polyamic acid esters with methacryloylethanol (hydroxyethylmethacrylate $HOCH_2CH_2OOCC(CH_2)CH_3$) or $\beta$-oxyethylmethacrylate, and maleimide and a photoinitiator that react under the influence of radiation of the appropriate frequency and intensity to cause crosslinking through the hydroxyethylmethacrylate groups. The crosslinked polyamic ester intermediate remains insoluble during organic solvent development. The patterned crosslinked polyamic ester is then heat cured to about 400° C. to cause dissociation of the aliphatic crosslinking groups and formation of the final thermally stable polyimide patterns.

As an alternative to the conventional photosensitive imidizable materials based on Siemens technology involves amine salt formulations instead of esters. Typical mixtures comprise a polyamic acid and a crosslinkable monomer amine such as dimethylaminoethylmethacrylate $[(CH_3)_2NCH_2CH_2OOCC(CH_2)CH_3)]$ and a photoinitiator to function as photosensitive compositions which are processed similarly to the polyamic esters above.

In addition to the photosensitive polyimides based on Siemens technology, there have been reports describing preparation of photosensitive compositions by incorporation of photoactive compounds in standard polyamic acids. These formulations can be patterned according to conventional lithographic techniques using aqueous base developers and form positive tone patterns. However, this approach has not found practical application due to the problem that a very high percentage loading of photoactive compound is needed for creating any differential in the dissolution behavior of the exposed versus the unexposed area to allow pattern generation. This results in degradation of mechanical and electrical properties of the imidized patterned films. Also, resolution and image quality are less than satisfactory especially in the case of thicker films.

Various references broadly disclose photosensitive imidizable materials, but none describes the compositions or performance benefits of the material systems of our invention or the method of its application in the fabrication of microelectronics.

U.S. Pat. No. 4,661,435 discloses the preparation of photosensitive polyamic acid derivatives by a method which comprises the treatment of a polyamic acid with an isourea derivative that transfers the O-substituent of the isourea as a half-ester product with the polyamic acid. These materials crosslink in ultraviolet light without the necessity of a catalyst or photoinitiator. Films of these materials may be patterned and thereafter thermally treated to cause imidization and are thus useful to incorporate the resultant polyimides in semiconductor devices and the like.

U.S. Pat. No. 4,551,522 discloses the preparation of photopolymerizable polyamic acid derivatives comprising the partial derivatization of an aromatic dianhydride with a reactive monomer containing a photosensitive moiety selected from the group of ethylenically unsaturated alcohols, thiols and amines, condensation of the partially derivatized aromatic dianhydride with an aromatic diamine to form a polyamic acid, isoimidization of the polyamic acid with N,N'-dicyclohexylcarbodiimide or trifluoroacetic acid anhydride, mixing a molar excess of the photosensitive monomer with the polyisoimide in an aprotic solvent to convert the polyisoimide to the corresponding polyamic acid derivative.

U.S. Pat. No. 4,565,767 is directed to light-sensitive polymer compositions comprising a polyamic acid, a bisazide selected from 2,6-di(4'-azidobenzal)- and 2,6-di(4'azidocinnamylene)-4-substituted cyclohexanones, and a tertiary amine having an unsaturated side chain. After the relief patterns are formed by development of the exposed polyamic acid compositions, the patterned layer may be thermally converted to the corresponding polyimide.

U.S. Pat. No. 4,093,461 discloses positive-acting, thermally-stable photoresist compositions comprising a polyamic acid and an o-quinone diazide or a naphthoquinone diazide photoinitiator. These compositions may be imidized after patterning and development.

U.S. Pat. No. 4,395,482 discloses the preparation of photosensitive polybenzoxazoles precursors by the condensation of aromatic and/or heterocyclic dihydroxydiamino compounds with dicarboxylic acid chlorides and esters. These materials may be sensitized with light-sensitive diazoquinones. After exposure and development to form patterns, the patterned polybenzoxazole precursor material is converted to highly heat resistant polybenzoxazole by thermal treatment.

U.S. Pat. No. 4,803,147 discloses imageable polyimide compositions comprising a solvent soluble polyimide which is a condensation product of an aromatic dianhydride and an aromatic primary diamine wherein at least one of the dianhydride and diamine has a hexafluoroisopropylidene or 1-phenyl-2,2,2-trifluoroethane bridge, a photoinitiator (a diazine or triazine) and a photopolymerizable compound containing at least two terminal ethylenically unsaturated groups.

IBM Technical Disclosure Bulletin, Vol. 23, No. 10, pp. 4782–83 (March 1981) describes photoactive polyimide compositions made by the addition of about 6–15% by weight of a photoactive compound to a polyimide and their subsequent exposure, development and patterning. These materials are base developable to form positive images and the photoactive compound is typically a diazoquinone or the like.

D. N. Khanna and W. H. Mueller, "Photopolymers: Principles, Processes and Materials," Regional technical Conference Proceedings, p. 429–43, Oct. 30-Nov. 2, 1988, Ellenville, N.Y., discloses positive working photoresists based on hydroxy polyimides and hydroxy polyamides which contain hexafluoropropylidene (6F) linking or bridging groups. These materials are prepared using solution condensation techniques and are sensitized with photoinitiators such as diazonaphthoquinones. Hydroxypolyamides are synthesized by a low temperature condensation process and are then converted to the polybenzoxazoles of U.S. Pat. No. 4,395,482. The disclosed hydroxypolyimides are synthesized by the high temperature solution condensation process described in European Patent Publication 0 163 518. Use of this method causes chain degradation and leads to significant decreases in viscosity and molecular weight resulting in inferior polymer properties. In order to alleviate some of the drawbacks, it has been found to be desirable to formulate copolymers having chain units free from the hydroxydiamine end groups.

European Patent Publication 141,781 discloses a photosensitive polyimide composition comprising a polymethyl substituted soluble polyimide and a bisazide. Upon exposure, the exposed area undergoes crosslinking and becomes less soluble which allows image development by conventional solvent techniques. The presence of methyl groups is undesireable as it leads to poor thermal and oxidative stability.

SUMMARY OF THE INVENTION

We have found that both positive and negative working imageable polymer compositions of improved lithographic performance are formed with hydroxypolyamic acids, the corresponding hydroxypolyamic esters, and hydroxypolyimides when prepared and processed according to the methods of this invention. These compositions are based upon two-component systems where the photoactive element is incorporated into the resin matrix or as one-component systems where the photosensitive moiety is covalently bonded to the polymer chain through the hydroxyl group. Especially useful are those imageable polymers having at least one 6F (2,2'-hexafluoropropylidene) bridging group in either diamine or dianhydride reactant. When prepared and processed as described, these materials have been found to provide superior performance in multifunctional applications including use as high temperature resists, as high-energy ion-implant mask, as imageable dielectric and as imageable $O_2$ RIE (reactive ion-etch) resistant masks for bilayer resist processes.

There are provided stable imageable compositions comprising a condensation polymer of a bis-(3-amino-4-hydroxyphenyl) composition of the structure

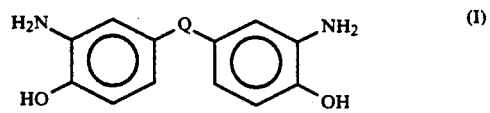

where Q is

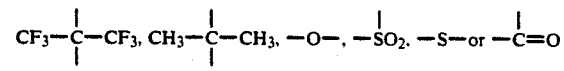

and of a dianhydride selected from the group consisting of bis-(3-3,4-dicarboxyphenyl anhydride) composition of the structure (II)

where Z is $$CF_3-\underset{|}{\overset{|}{C}}-CF_3,\ CH_3-\underset{|}{\overset{|}{C}}-CH_3,\ -O-,$$

$$-SO_2,\ -S-,\ -\underset{|}{\overset{|}{C}}=O,\ or\ -O-Ar-S-Ar-O-,$$

where Ar is p-phenyl, and of aliphatic tetracarboxyllic dianhydrides of the form (III)

and (IV)

and a photoactive composition selected from the group consisting of diazoketones, diazoquinones and bisazides. The preferred compositions have at least one $$CF_3-\underset{|}{\overset{|}{C}}-CF_3$$

group present in the polymer.

DETAILED DESCRIPTION OF THE INVENTION

The present invention relates to improvements in photosensitive polyimide compositions and processes using such polyimide compositions in the fabrication of microelectronic devices. One embodiment of this invention comprises improved synthesis of hydroxypolyamic acids utilizing hydroxydiamines selected from the group consisting of 2,2'-bis-(3-amino-4-hydroxyphenyl)-hexafluoropropane V, (V)

2,2'-bis-(3-amino-4-hydroxyphenyl)-propane VI, (VI)

3,3'-diamino-4,4'-dihydroxydiphenyl ether VII, (VII)

3,3'-diamino-4,4'-dihydroxydiphenyl sulfone VIII, (VIII)

3,3'-diamino-4,4'-dihdyroxydiphenyl sulfide IX and (IX)

3,3'-diamino-4,4'-dihydroxybenzophenone X (X)

and dianhydrides selected from the group consisting of 2,2'-bis-(3,4-dicarboxyphenyl)-hexafluoropropane dianhydride XI, (XI)

2,2'-bis-(3,4-dicarboxyphenyl)-propane dianhydride XII, (XII)

3,3',4,4'-benzophenone tetracarboxylic acid dianhydride XIII,

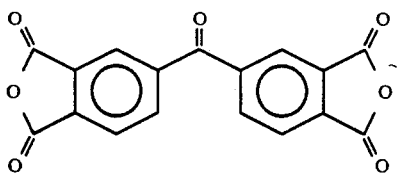

oxydiphthalic anhydride XIV,

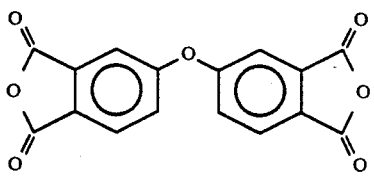

bis(3,4-dicarboxyphenyl)sulfide dianhydride XV,

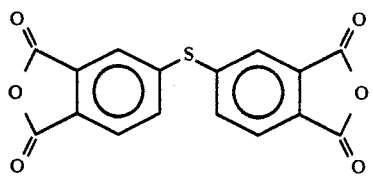

bis(3,4-dicarboxyphenyl)sulfone dianhydride XVI,

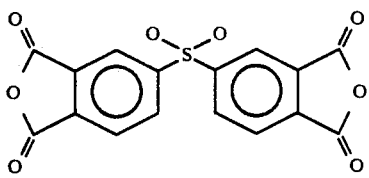

4,4'-bis(3,4-dicarboxyphenoxy)diphenyl sulfide dianhydride XVII

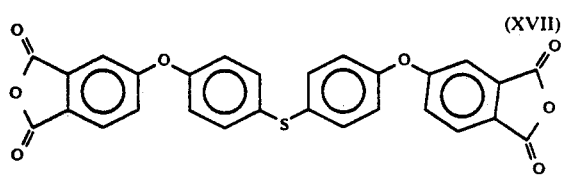

5-(2,5-diketotetrahydrofur-3-yl)-3-methyl-3-cyclohexene-1,2-di- carboxylic acid anhydride III

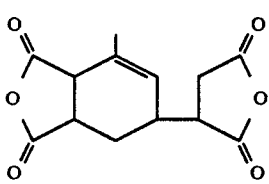

bicyclo[2.2.2]-7-octene-2,3,5,6-tetracarboxylic acid dianhydride IV

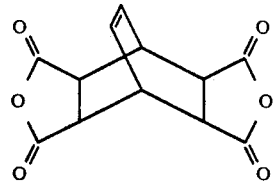

Another object of this invention is to provide imageable hydroxypolyamic acids, hydroxypolyamic esters, hydroxypolyimides, and hydroxypolyisoimides derived from the synthesized hydroxypolyamic acid and including a photoinitiator to enable image formation and development.

Yet another object of the invention is to provide compositions which carry radiation sensitive functionalities covalently bonded through the hydroxy (—OH) group.

Another object is to provide imageable polymer compositions which have $O_2$ RIE resistance and carry a siloxane-containing functionality through the hydroxy (—OH) group.

Yet another object of this invention is to provide imageable compositions based on polyamic acids, polyamic esters and polyimides, and photosensitive compositions as diazonaphthoquinone sensitizer, or bisazides for positive or negative tone options.

Another object is to provide improved processes for application of these compositions as high temperature resists for high resolution patterns, low dielectric constant insulator, imageable lift-off layer, and high Tg ion implant mask which is strippable in organic solvents.

The dianhydrides, 2,2'-bis-(3,4-dicarboxyphenyl)-hexafluoro- propane dianhydride XI, 2,2'-bis-(3,4-dicarboxyphenyl)-propane dianhydride XII, 3,3',4,4'-benzophenone tetracarboxylic acid dianhydride XIII, oxydiphthalic anhydride XIV, bis(3,4-dicarboxyphenyl)-sulfide dianhydride XV, bis(3,4-dicarboxyphenyl)sulfone dianhdyride XVI, 4,4'-bis(3,4-dicarboxyphenoxy)-diphenylsulphide dianhydride XVII, 5-(2,5-diketotetrahydrofur-3-yl)-3-methyl-3-cyclohexene-1,2-di carboxylic acid anhydride III, and bicyclo[2.2.0]-7-octene-2,3,5,6-tetracarboxylic acid dianhydride IV are commercially available while the dihydroxydiamines 2,2' bis-(3-amino-4-hydroxyphenyl)-hexafluoropropane V, 2,2'bis-(3-amino-4-hydroxyphenyl)-propane VI, bis(3-amino-4-hydroxyphenyl)ether VII, bis(3-amino-4-hydroxyphenyl)sulfide VIII, bis(3-amino-4-hydroxyphenyl)thioether IX and 3,3'diamino-4,4'-dihydroxybenzophenone X can be readily synthesized according to the procedures found in the literature, e.g., K. S. Y. Lau, A. L. Lanelis, W. J. Kelleghan, D. Beard, J. Polym. Sci., (Polymer Chem.), 20, 2381-93 (1982).

Representative hydroxypolyamic acids, hydroxypolyamic esters, and hydroxypolyimides may be synthesized using various combinations of aforementioned hydroxydiamines and dianhydrides to include the following polymers:

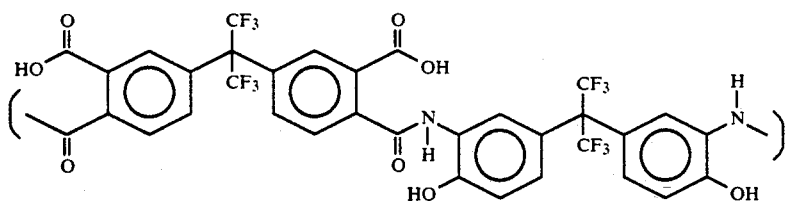
(XVIII)

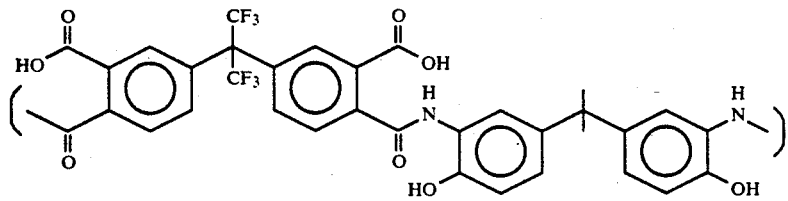
(XIX)

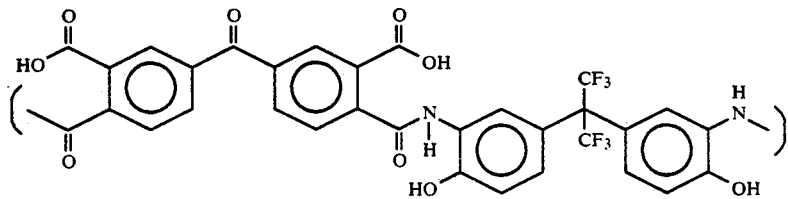
(XX)

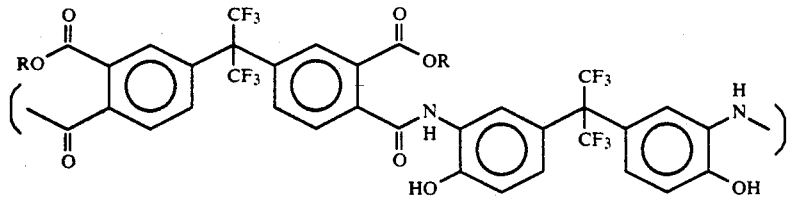
(XXI)

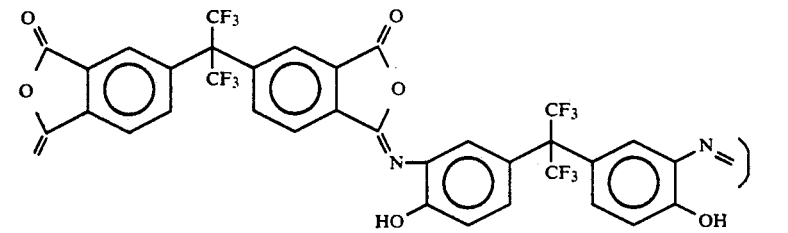
(XXII)

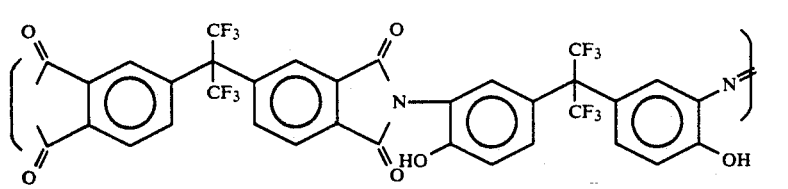
(XXIII)

According to this invention, these polymers are employed as the resin matrix for photosensitive compositions which are formed by incorporation of, for example, diazonaphthoquinone type sensitizers for positive tone and of, for example, aromatic bisazide sensitizers for negative tone images.

According to the invention, using polymer systems as shown for photosensitive formulations are prepared by incorporation of photoactive compounds to solutions of these polymers in suitable solvents such as N-methylpyrrolidone (NMP), diglyme, propylene glycol monomethyl ether acetate (PM-acetate) or mixtures thereof. For positive working compositions, diazonaphthoquinone-type sensitizers are incorporated in the range of 5–25% by weight based upon resin solids. For negative resists, bisazides such as 3,3'-diazidobenzophenone are similarly added to the resin solution. Patterning of the films is accomplished using standard procedures using UV, e-beam or x-ray exposure, followed by aqueous base development with AZ, AZ2401 or TMAH type developers. For use of the patterned films in high temperature processing, these are baked/cured to 250°–300° C. prior to metallization by sputtering or evaporation, ion implantation, or metal plate-up, and then the films can be easily removed by exposure to NMP or NMP-diglyme mixtures. For imageable dielectric applications, a bake/cure cycle at up to 350° C. provides solvent resistent films.

To provide one-component imageable polymers in this category, these hydroxyl group containing polymers are functionalized by reaction with reagents carrying photosensitive moiety. Representative examples of such systems are given below

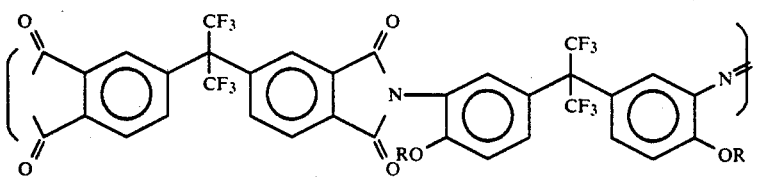 (XXIV)

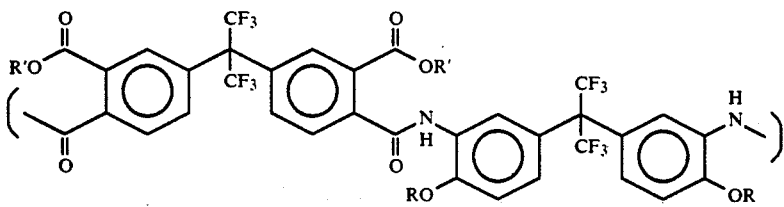 (XXV)

where R is selected from the group consisting of t-butyloxycarbonyl

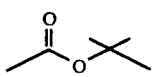 (XXVI)

glycidyloxy

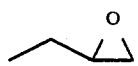 (XXVI)

isopropenylcarbonyl

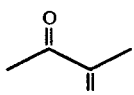 (XXVIII)

4-sulfonyl-1-oxo-2-diazonaphthalene

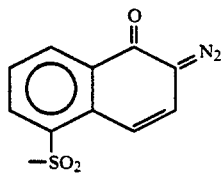 (XXVIX)

5-sulfonyl-1-oxo-2-diazonaphthalene

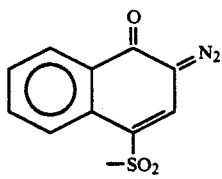 (XXX)

or a polysiloxane of the form

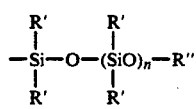 (XXXI)

where R' is methyl or ethyl and R" is methyl, ethyl, glycidoxyl or —Si(CH$_3$)$_2$—R''' (XXXII) where R''' is methyl, ethyl, glycidoxyl or vinyl.

These one-component imageable polymer systems illustrated can be patterned similarly using organic solvent developers or aqueous base developers depending on the nature of the photosensitive side chain and the relative ratio of free hydroxy group (—OH) to functionalized moiety.

These imageable compositions of the present invention offer the following improved characteristics:

(a) The hexafluoroisopropylidene group carrying polymer films are transparent which provide improved UV sensitivity, enhanced resolution as compared to novolak resin based resist systems, in conjunction with photosensitive components which absorb at wavelengths lower than 300 nm.

(b) The imidized polymers are soluble in lower boiling solvents such as diglyme, propylene glycol monomethyl ether acetate (PM-acetate) and mixtures thereof, which provide advantages in terms of shelf life, resist processability, and performance processability.

(c) The imidized films have high thermal stability, yet remain soluble in organic solvents such as NMP when cured to temperatures below about 250° C. (This allows use of imidized films to form patterned resists for use as ion implant masks, as lift-off layer or high temperature resist for metallization in multilayer resist processes.

(d) When patterned films are cured to high temperature (up to 350° C.), no image deformation is observed.

(e) The imidized films exhibit lower dielectric constant (less than about 3.0) than previously known in Siemens or like processes enabling imageable dielectric applications.

(The imageable hydroxypolyimide and precursor compounds have lower moisture uptake than has been experienced with previously known materials for such applications.)

(f) With the imageable polyimides of the invention, much lower shrinkage (10-15 %) is observed on curing to 350° C. as compared to up to 50% decrease in thickness experienced with photosensitive imidizable materials upon imaging, developing and curing.

(g) The photosensitive polyimides of the invention show controlled dissolution rates, excellent performance and reproducibility to form high resolution patterns (submicron images).

We have found that imidization of the polyamic acids in dry powder form under vacuum and controlled temperature in the 150°-180° C. range provides superior material with no degradation in molecular weight. This method is different from the commonly employed solution imidization which are found with these materials to result in significant decreases in molecular weight and unsatisfactory performance of the end product.

For high resolution (1 μm or less) and near vertical wall images, it is found that 80-90% imidized material derived from 6F/6F polyamic acid prepared by stoichiometric offset is preferred as resin matrix. Imageable formulations are prepared by incorporating 15-20% diazonaphthoquinone type sensitizers based on 25-30% resin solids in diglyme-PM acetate (90:10) as solvent. Preferred range for the dianhydride:diamine stoichiometry offset in the synthesis of polyamic acid is found to be 1:0.95 to 1:0.8 with the diamine in excess.

When making polyamic acid using reactants which have offset stoichiometry, it is preferred to add a quenching or chain terminating compound after polyamic acid formation. The quenching or chain terminating compound will typically be a compatible aromatic anhydride such as phthalic anhydride or hydroxy-phthalic anhydride.

Negative working formulations prepared by incorporating bisazides into polyamic acid or polyimide solution provide pattern profiles varying from straight wall to those suitable for lift-off application when different developers such as AZ or AZ 2401 are employed.

In a Modified Image-Reversal Process (MIRP) where small amount of imidazole is used in conjunction with diazonaphthoquinone sensitizers in polyamic acid, nearly vertical wall profiles with high resolution patterns are formed as shown by scanning electron microphotographs.

The following examples are illustrative of the invention.

According to this invention it was found that higher resolution patterns with high aspect ratio (1 μm features in 1 μm thick films) were obtained with 6F/6F polyimide synthesized by stoichiometry offset such that the diamine:dianhydride ratio varied between 1:0.87 and 1:0.095. Preferred molecular weight of the polyamic acid and polyimide derived therefrom is 12000-15000. For thicker films (greater than 5μm, it was preferred to use 1:1 stoichiometry of dianhydride and diamine in NMP:diglyme:xylene (80:15:5) as solvent with a solids content of 25-30 using polyamic acid as matrix resin, photosensitive compositions were obtained by addition of 12-20% diazonaphthoquinone or aromatic bis-azide type sensitizers. Such compositions were used to form up to 15 μm thick films which were processed through the standard lithographic sequence, gave excellent quality patterns. In the case of positive tone images, typical wall angles of bettr than 70 were obtained while with negative tone patterns, wall profiles varied from straight wall to those with undercut suitable for metal liftoff. Typical resolution in thick films was 2.5 μm fully developed features in 7-10 μm thick films; 0.875 μm features in 2.5 μm thick films.

EXAMPLE 1

The condensation reaction of
2,2-bis(3,4-dicarboxyphenyl) hexafluoropropane dianhydride (XI) and
2,2-bis(3-amino-4-hydroxyphenyl)hexafluoropropane (V) to form the corresponding polyamic acid product was carried out as described below:

A 500 ml 3-neck flask was equipped with a stirrer, thermometer, and a high purity nitrogen or argon purge adapter system to maintain dry and inert ambient during reaction. The flask was charged with 160 g of freshly distilled N-methyl-pyrrolidone, 40 g diglyme (reagent grade, Aldrich) and 20 g xylene, followed by 36.6 g diamine V (0.1 mole, MW 366) with stirring. When the diamine had completely dissolved (2 hours), 44.4 g of dianhydride XI (0.1 mole) was added as solids in portions such that the temperature remained below 30° C. which took about 30 min. After addition was complete, stirring was continued overnight, a high viscosity clear/transparent solution of the polyamic acid XVIII was formed having about 27% solids.

EXAMPLE 2

A polyamic acid product of the condensationn reaction of 2,2-bis(3,4-dicarboxyphenyl) hexafluoropropane dianhydride (XI) and 2,2-bis(3-amino-4-hydroxyphenyl)hexafluoropropane (V) with stoichiometry offset was prepared as described below:

Using the equipment setup as given in Example 1, 36.6 g (0.1 mole) of diamine V was dissolved in 140 g NMP and 30 g diglyme by stirring for 1-2 hours. The dianhydride XI, 39.9 g (0.09 mole) was then added as solid in portions such that the temperature was maintained below 30° (about 30 min.). Stirring was continued overnight forming a clear/transparent polyamic acid solution XVIII having low viscosity.

EXAMPLE 3

Preparation of polyimide XXIII from the polyamic acid of Example 2:

The polyamic acid XVIII from Example 2 was slowly dropped into water as a fine spray with rapid stirring to precipitate the solids which were recovered by filtration. After repeated washing of the precipitated solids with deionized water, these were dried under vacuum at 50°-60° C. The dried powder was then heated at 140°-180° C. under vacuum to cause imidization and formation of polyimide XXIII. This material can be dissolved in diglyme-PM acetate up to 40% solids to form clear solution for use as resin matrix for preparation of photosensitive compositions. This polyimide has a dielectric constant of 2.6-2.7.

EXAMPLE 4

Preparation of positive working photosensitive polyamic acid and polyimide compositions and processing:

To 100 g of polyamic acid XVIII of example 1 (about 27% solids) was added 5.1 g diazonaphthoquinone based photoactive compound (18.5% based on resin solids) and well mixed to form a clear solution. This was filtered through 1 μm silver filter prior to use. Solution is applied by spin coating on silicon wafers which had been precleaned, $O_2$ plasma exposed, and adhesion promoted with 0.1-0.2% solution of 3-aminopropyl-triethoxysilane [$H_2NCH_2CH_2CH_2Si(OC_2H_5)_3$] in water or ethanol-water mixture. Photosensitive polymer formulation is applied at 2,000 rpm for 30 sec. on silicon wafer and prebaked for 30 min. at 85°-90° C. in an oven or 5 min. at 85° on hot plate. The films are image-wise exposed through a mask using an Oriel contact printer at 350-400 mJ/cm$^2$ or using a Perkin-Elmer 500 exposure system, followed by pattern development using 1:25 diluted AZ developer to give 15 μm line and space patterns clearly resolved in a 15 μm thick film.

With thinner films formed by dilution of the above formulation, upon similar lithographic processing, image resolution up to 1.5 μm lines and spaces in 10 μm thick films and 0.75 um lines and spaces in 1.5 μm thick films. Pattern wall profiles in these cases were typically 60°-80°. The dielectric constant of imaged formulations was between 2.8 and 2.9.

EXAMPLE 5

Preparation of photosensitive polyamic acid formulations for negative tone patterning.

To 100 g of polyamic acid XVIII of example 1 (about 27% solid) was added 5.6 g of 3,3'diazidobenzophenone and well mixed to form a clear solution. This was diluted to 15% solids and then filtered through 0.5 um silver filter and applied on silicon wafers (surface modified as above in prior example) by spin coating, prebaked at 105° for 30 min., imagewise exposed using Oriel contact printer to give 46 mJ/cm$^2$ at 260 nm. Pattern development using diluted (1:20) AZ developer, showed negative tone pattern with resolution up to 0.875 μm lines in 1.2 μm thick films. Lift-off profile when using AZ developer, and 1.5 μm straight wall images when AZ 2401 was used.

EXAMPLE 6

Performance of modified example 4 formulation in a Modified Image Reversal Process (MIRP):

To the photosensitive formulation described in example 4 was added 3% imidazole (based upon diazonaphthoquinone sensitizer) and mixed to form a clear solution. This was applied on silica wafers as in the above examples, prebaked to 90° C. for 30 min., UV exposed using a contact mask, baked at 110°-120° C. for 30 min. and then blanket exposed followed by development using diluted AZ type developers to form negative tone patterns.

EXAMPLE 7

Preparation of t-BOC Functionalized Polyimide XXVIII:

7.74 g of Polyimide XXV (Example 3) was dissolved in 50 ml methanol in a round bottom flask under inert atmosphere followed by the addition of 1.09 g of di-t-butyl dicarbonate in 10 ml methanol. To which 0.2 g sodium hydroxide in 5 ml methanol was then added dropwise with stirring at room temperature and stirring continued overnight. An acetic acid solution was added to neutralize the excess base with an additional amount of acid so that the solution became slightly acidic. The product was precipitated by slowly dropping into vigorously stirred water and recovered by filtration. The precipitate was washed repeatedly with deionized water and dried under vacuum at 30° C. to give functionalized polyimide XVI.

EXAMPLE 9

Photosensitive Composition Based on XVI and process for pattern generation.

To 10 g of polyimide XXVI in 50 ml of a 70:30 diglyme-PM acetate solution was added 0.8 g of triphenylsulfoniumhexa- fluoroantimonate, an acid generating sensitizer (a "photoacid"). The solution was spin-applied on a silicon wafer that had been adhesion promoted with a silane coupling agent (B-aminopropyltriethoxy-silane)and the film was baked for 1 minute on a 90° C. hot plate to provide 1.2 um thick film. Deep UV exposure at 20-40 mJ/cm$^2$ using a contact mask or Perkin-Elmer 500 followed by a 90° C. hot plate bake for 90 seconds and solvent development using aqueous tetramethylammonium hydroxide (TMAH) gave high resolution positive tone images.

EXAMPLE 10

To 29.28 g(0.08 moles) of 2,2'-bis'(3 amino-4-hydroxyphenyl) hexafluoropropane (V) dissolved in 142.24 g NMP was added 31.68 g (0.071 moles) of 2,2'-bis-(3,4 dicarboxyphenyl) hexafluoropropane dianhydride (XI) in small portions. After the reaction was completed, phthalic anhydride was added to end-cap (and tie-up) the unreacted amine. (3-hydroxythalic anhydride may also be used.) The resultant poly amic acid was precipitated in water and dried in a vacuum at 50° C. After drying, imidazation was accomplished by putting the dry polyamic acid powder on a dish or tray in a vacuum oven and heating the powder for 4 hours at about 180° C. to cause imidazation.

EXAMPLE 11

Use of bilayer thick films.

Hydroxypolyamic acids of structure XVIII prepared by the method of Example 1 were formulated with diazonaphthoquinone sensitizers in accordance with the method of Example 4 such that one formulation had about 12% of that sensitizer which was used as the lower or underlayer and the other formulation having about 18-20% sensitizer was used as a top layer. The underlayer was coated onto silicon wafers followed by baking at 86° C. for about 10 min. Then the top layer was applied and the composite structure was baked at 86° C. for 20 min. The composite film thickness after baking was about 14 μm. The coated wafers were imagewise exposed and developed with dilated (1:25) AZ developer to give excellent images with 11-12 μm thickness remaining.

EXAMPLE 12

Synthesis of 4,4'-bis(3,4 dicarboxy-phenoxy) diphenyl sulfide dianhydride 2,2'bis(3-amino-4 hydroxy phenyl) hexafluoropropane polyamine acid.

Using the general experimental conditions described in Example 1, 18.3 g (0.05 mole) of 2,2'bis(3 amino-4 hydroxyphenyl) hexafluoropropane (V) was dissolved in a 125 g NMP and 25 g diglyme mixture in a 500 ml three neck flask under dry nitrogen. To this solution was added 25.5 g (0.05 mole) of 4,4'bis-(3,4 dicarboxyphenoxy) diphenyl sulfide dianhydride (XVII) in portions with gentle stirring such that the temperature was maintained below 30°-32° C. When the addition of the dianhydride was complete, the reaction mixture was stirred for 4-6 hours forming a clear solution of polyamic acid having 22.6% solids content.

EXAMPLE 13

Photosensitive formulation derived from polyamic acid of Example 12 and patterning films mode therewith.

To 10 g of the polyamic acid of Example 12 was added 0.43 g of diazonaphtho-quinone sensitizer and the solution was agitated to cause thorough mixing. The solution was filtered through a 0.2 μm silver membrane and was spin applied at 3000 rpm for 30 sec. on surface modified silicon wafers (oxygen plasma cleaning followed by A1100 application). The coated wafers were prebaked in a convection oven at 85° C. for 30 min. to give films about 2 μm thick. Imagewise exposure with 2.50 mJ/cm$^2$ at 400 nm and image development in 1:25 AZ developer gave excellent quality positive tone patterns with 1-15 μm resolution and film thickness loss of about 10-15% during the development process.

EXAMPLE 14

Synthesis of polyamic acid from 2,2'bis(3,4 dicarboxyphenyl)-hexafluoro propane dianhydride and 3,3'diamino-4,4'dihydroxy diphenyl sulfone.

In a procedure similar to that of Example 1, 14.2 g (0.05 mole) of 3,3'diamino-4,4'-dihydroxy diphenyl sulfone (VIII) was dissolved in 100 g of high purity NMP in a 250 ml three neckflask under nitrogen. To this solution was added 22.4 g (0.05 mole) 2,2'bis(3,4 dicarboxyphenyl) hexafluoro-propane dianhydride (XI) in portions with stirring. After the addition was completed, stirring was continued overnight. A high viscosity clear solution of polyamic acid was formed having a 26.4% solids content.

EXAMPLE 15

Synthesis of polyamic acid from 3,3',4,4'-benzophenone tetracarboxylic acid dianhydride and 3,3'diamino-4,4'dihydroxy-diphenyl sulfone.

Using a reaction scheme similar to that set forth in Example 14, a polyamic acid was prepared by reacting 6.44 g (0.02 mole) of 3,3',4,4'-benzophenone tetracarboxylic acid dianhydride (XIII) with 3,3'diamino-4,4'dihydroxydiphenyl sulfone (VIII) in 40 g NMP. The polyamic acid solution had 23% solids content.

EXAMPLE 16

Synthesis of polyamic acid from 2,2'(bis 3,4 dicarboxyphenyl-)hexafluoro propane dianhydride and 3,3'diamino-4,4'dihydroxy-diphenyl sulfide.

In a method similar to that of Example 14, 5.36 g(0.02 mole) of 3,3'diamino-4,4'dihydroxy-dipenyl sulfide was dissolved in 50 g NMP. To the resulting solution was added 8.88 g of 2,2'(bis 3,4 dicarboxyphenyl) hexafluoro propane dianhydride (XI) in portions. After the addition was complete, the mixture was stirred for 4-6 hours yielding a polyamic acid solution having 22% solids content.

EXAMPLE 17

A negative working photosensitive formulation was prepared using 10 g of a polyamic acid or made from 2,2'bis(3 amino-4 hydroxyphenyl) hexafluoro propane (V) and 3,3',4,4'benzophenone tetracarboxylic acid dianhydride (XIII) and 0.38 g of a m-diazido-benzophenone sensitizer.

EXAMPLE 18

Synthesis of polyamic acid from 2,2'-bis(3-amino-4-hydroxyphenyl) propane and 2,2'-bis-(3,4-dicarboxyphenyl) hexafluro-propane dianhydride.

12.9 g (0.05 mole) of 2,2'bis(3-amino-4-hydroxyphenyl) propane (VI) was dissolved in a solution of NMP/diglyme/xylene in the ratio of 65 g:20 g:5 g. To this solution 22.2 g (0.05 mole) of 2,2'bis(3,4-dicarboxyphenyl) propane dianhydride(XI) was added in portions over 30 min. After the addition was complete, stirring was continued overnight forming a clear, high viscosity polymer having 28% solids content.

EXAMPLE 19

A polyamic acid was prepared in diglyme from 2,2'bis(3 amino-4-hydroxy-phenyl) hexafluoropropane (V) and 5(2,5-diketotetrahydrofur-3-yl)-3-methyl-3cyclohexene-1,2-dicarboxylic acid anhydride III having 20-30% solids content. A photosensitive formulation was prepared by adding 18-20% diazonaphthequinone based on polyamic acid solids. The formulation was spin applied to silicon wafers and prebaked at 85° for 30 min. The coated wafers were exposed and the images were developed using very dilute AZ developer.

EXAMPLE 20

Comparative Example

In addition, the experimental preimidized Sixef-44 polymer

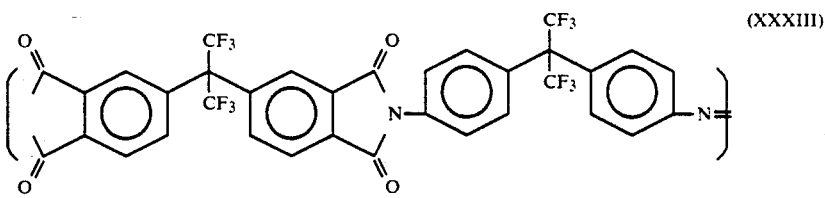

of Hoechst was sensitized with bisazide, patterned with UV radiation and developed with methanolic TMAH to give negative tone patterns of 0.8 um thickness when starting with 1.2 um thick films (2-3 μm were found to crack during processing). These films can be used as imageable lift-off layers for metal patterning.

Sixef-44 was sensitized with 3,3'-diazidobenzophenone. The resulting film was spin applied to silicon wafers and baked to 90° C. for 30 minutes to give 1.2 μm thick film. The coated wafers were contact exposed for 6" (45 mJ/cm² at 280 nm) developed in methanolic TMAH (4% in methanol) to give good quality negative patterns with 0.8-0.9 um thickness remaining.

We claim:

1. A thermally stable photosensitive polymer composition comprising a substantially gel-free polyamic acid, polyamic ester or polyimide formed in a solvent comprising a N-methylpyrrolidone-diglyme mixture by the condensation of (a) a bis-(3-amino-4-hydroxyphenyl) composition of the structure

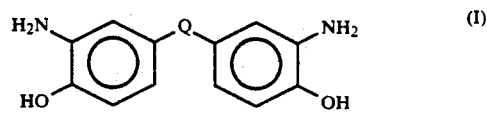

where Q is selected from the group consisting of

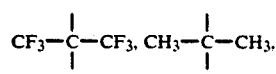

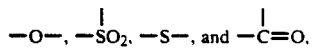

and (b) a dianhydride selected form the group consisting of
(1) a bis-(3,4 dicarboxyphenyl) anhydride composition of the structure

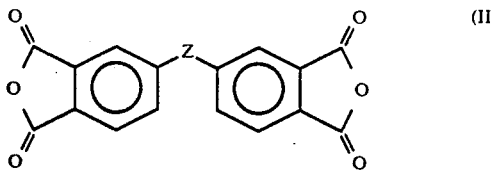
(II)

where Z is selected from the group consisting of

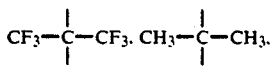

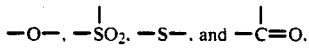

and
(2) an aliphatic tetracarboxylic anhydride of the form

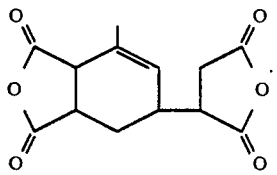
(III)

and

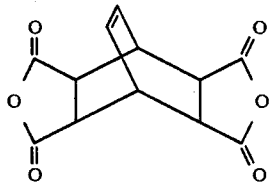
(IV)

and
a photoactive compound.

2. The photosensitive polymer of claim 1 wherein at least one of Q and Z is

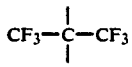

3. The photosensitive polymer of claim 1 wherein the mole equivalent ratio of diamine to dianhydride is from 1:1 to 1.25:1.

4. The photosensitive polymer of claim 3 which includes a chain terminating group selected from the group consisting of phthalic anhydride and hydroxyphthalic anhydride.

5. The photosensitive polymer of claim 1 wherein the photoactive compound is a diazoketone or bisazide.

6. The photosensitive polymer of claim 1 which is developable in aqueous alkaline developer.

7. The photosensitive polymer of claim 6 wherein the developer is potassium hydroxide, sodium hydroxide or tetramethyl ammonium hydroxide.

8. The photosensitive polymer of claim 1 which is solvent strippable.

9. The photosensitive polymer of claim 1 which is solvent strippable after heat treatment to about 250° C.

10. The photosensitive polymer of claim 1 wherein the solvent further comprises xylene.

11. A thermally stable photosensitive polymer composition comprising a polyamic acid, polyamic ester or polyimide formed in a solvent comprising a N-methylpyrolidone-diglyme mixture by the condensation of
(a) a bis-(3-amino-4-hydroxyphenyl) composition of the structure

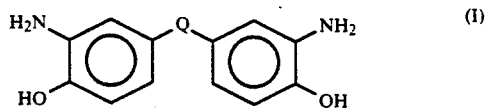
(I)

where Q is selected from the group consisting of

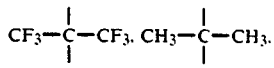

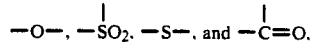

(b) a dianhydride selected from the group consisting of
(1) a bis-(3,4 dicarboxyphenyl) anhydride composition of the structure

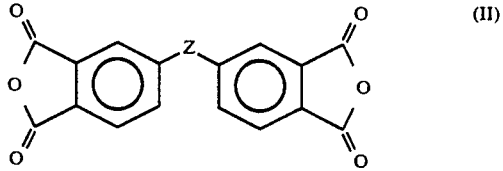
(II)

where Z is selected from the group consisting of

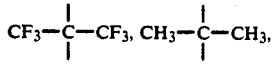

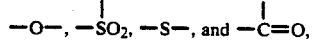

and
(2) an aliphatic tetracarboxylic anhydride of the form

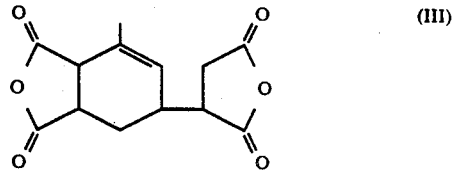
(III)

-continued
and

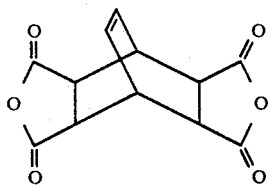
(IV)

where the polyimide is functionalized through its hydroxy groups.

12. The photosensitive polymer composition of claim 11 where the functionalizing group is a t-butyloxycarbonyl group, epoxypropyl group, methacryloyl group, o-naphthoquinone diazide-4-sulfonyl group, o-naphthoquinone diazide-5-sulfonyl group, or a polysiloxane group.

13. The photosensitive polymer composition of claim 11 wherein the mole equivalent ratio of diamine to dianhydride is from 1:1 to 1.25:1.

14. The photosensitive polymer composition of claim 13 which includes a chain terminating group selected from the group consisting of phthalic anhydride and hydroxyphthalic anhydride.

15. The photosensitive polymer composition of claim 13 wherein the mole equivalent ratio of diamine to dianhydride is from 1.05:1 to 1.25:1.

16. The photosensitive polymer composition of claim 15 which is imageable to provide high resolution submicron images in thin films.

17. The photosensitive polymer of claim 11 which further comprises a photoactive compound.

18. The photosensitive polymer of claim 17 wherein the photoactive compound is a diazoketone or bisazide.

19. The photosensitive polymer of claim 11 which is developable in aqueous alkaline developer.

20. The photosensitive polymer of claim 19 wherein the developer is potassium hydroxide, sodium metasilicate or tetramethyl ammonium hydroxide.

21. The photosensitive polymer of claim 11 which is solvent strippable.

22. The photosensitive polymer of claim 11 which is solvent strippable after heat treatment to about 250° C.

23. The photosensitive polymer of claim 11 wherein the solvent further comprises xylene.

* * * * *

UNITED STATES PATENT AND TRADEMARK OFFICE
CERTIFICATE OF CORRECTION

PATENT NO. : 5,114,826
DATED : May 19, 1992
INVENTOR(S) : Ranee W. Kwong, Harbans S. Sachdev, Krishna G. Sachdev It is certified that error appears in the above-indentified patent and that said Letters Patent is hereby corrected as shown below:

In Column 15, line 26, after "This was applied on,"

please delete "silica" and insert -- silicon --.

Signed and Sealed this

Nineteenth Day of December, 1995

Attest:

BRUCE LEHMAN

Attesting Officer

Commissioner of Patents and Trademarks